United States Patent [19]

Seavey

[11] Patent Number: 5,247,249
[45] Date of Patent: Sep. 21, 1993

[54] BI-LEVEL TEST FIXTURE

[75] Inventor: Bruce A. Seavey, North Attleboro, Mass.

[73] Assignee: TTI Testron, Inc., Woonsocket, R.I.

[21] Appl. No.: 835,286

[22] Filed: Feb. 13, 1992

[51] Int. Cl.$^5$ ............................................. G01R 31/02
[52] U.S. Cl. ............................. 324/158 F; 324/158 P
[58] Field of Search ............... 324/158 F, 158 P, 72.5; 439/482

[56] References Cited

U.S. PATENT DOCUMENTS

| | | | |
|---|---|---|---|
| 4,230,985 | 10/1980 | Matrone et al. | 324/158 F |
| 4,626,776 | 12/1986 | Wilkinson | 324/158 P |
| 4,636,723 | 1/1987 | Coffin | 324/158 F |
| 4,746,861 | 5/1988 | Nesbitt | 324/158 F |

Primary Examiner—Vinh Nguyen
Attorney, Agent, or Firm—Salter, Michaelson & Benson

[57] ABSTRACT

A bi-level test fixture for testing printed circuit boards includes a shuttle plate which is reciprocated between first and second testing positions by a motorized actuator assembly. The actuator assembly includes an eccentric circular cam mounted on a rotating drive shaft of a geared electric motor, wherein the cam is received in a rectangular aperture in the shuttle plate. The aperture forms a bearing surface for the cam, and as the cam is rotated it slidingly engages the walls of the aperture for shifting the shuttle plate between the testing positions. A switching assembly is provided for switching the motor on when the shuttle plate is in one of the testing positions, and for automatically switching the motor off after the shuttle plate reached the other testing position.

10 Claims, 4 Drawing Sheets

BI-LEVEL TEST FIXTURE

BACKGROUND OF THE INVENTION

The instant invention relates to test fixtures which are utilized in the computerized testing of printed circuit board assemblies, and it more particularly relates to a bi-level test fixture which utilizes a motor driven shuttle plate actuator for movement of the shuttle plate between first and second testing positions.

Computerized test systems have generally been found to be highly effective for use in testing printed circuit board assemblies, particularly when testing large quantities of identical printed circuit board assemblies such as those which have been manufactured in mass production operations. In particular, computerized test systems have been found to be effective for both functional testing, wherein circuit boards are tested in a mode that simulates actual use, and incircuit testing wherein the components of circuit boards are individually tested.

Heretofore, specialized test fixtures have been available for performing both functional testing and incircuit testing. These specialized test fixtures are commonly referred to as bi-level test fixtures and they typically include two sets of spring-loaded contact probes of two different lengths which are installed so that they extend upwardly to two different heights above the probe plate, a diaphragm plate for supporting a circuit board above the probe plate, and a vacuum system for drawing the circuit board downwardly into contact with the probes on the probe plate. In a system of this type the higher set of probes is normally utilized for the functional testing circuit boards, and the lower set of probes is normally utilized for the incircuit testing. When a system of this type is operated in a functional test mode the diaphragm plate thereof is drawn downwardly to an upper test level in which the circuit board makes contact with only the higher probes, and when a system of this type is operated in an incircuit test mode the diaphragm plate is drawn further downwardly to a lower test level where the circuit board makes contact with both sets of probes.

The heretofore available bi-level test fixtures have utilized various known mechanisms for positioning the diaphragm plates thereof at the upper and lower testing levels thereof. One such mechanism comprises a thin sliding plate, commonly referred to as a "shuttle plate", which has a plurality of spaced projections or stop discs mounted on the upper surface thereof. In this regard, a shuttle plate of this type is normally disposed between the probe plate and the diaphragm plate of a fixture and it is adapted to be shifted back-and-forth between two test positions, one wherein the stop discs are aligned with corresponding holes in the bottom of the diaphragm or plate, and one wherein the stop discs are in nonaligned relation with the holes. When the stop discs are in nonaligned relation with the holes and the diaphragm plate is drawn downwardly, the stop discs engage the diaphragm plate to retain it in the upper testing position. When the stop discs are in aligned relation with the holes and the diaphragm plate is drawn downwardly, the stop discs pass into the corresponding holes to allow the diaphragm plate to be drawn downwardly to the lower testing position.

Most of the heretofore available bi-level test fixtures had either utilized solenoids or air cylinders for shifting the shuttle plates thereof back-and-forth. However, it has also been found that both of these apparatus have significant disadvantages which indicate a need for a more effective shifting apparatus. Specifically with regard to air cylinder actuators, it has been found that most computerized testing facilities do not have readily available compressed air supplies, and that in the facilities which do have readily available air supplies it is often very inconvenient to connect the air supplies to test fixtures. With regard to solenoid actuators, it has been found that because solenoids do not generate significant amounts of force for their size, relatively large solenoids are generally required to slide the shuttle plates of fixtures. It has been found that because of this test fixtures which include solenoid actuators often require the use of oversized fixture housings. Even further, it has been found that large solenoids require significant amounts of electrical power which normally cannot be accommodated with normal system relays. Still further, it has been found that when the power to the solenoids is turned off, the shuttle plates attached thereto are often freely slidable within fixtures, and that as a result, they can cause inadvertent damage thereto.

SUMMARY OF THE INVENTION

The instant invention provides a bi-level test fixture which utilizes a motor driven actuator assembly to actuate a shuttle plate between first and second testing positions. Briefly, the test fixture comprises a housing assembly, a probe plate assembly, a shuttle plate, a diaphragm plate assembly contained within a peripheral upper frame, and a motorized shuttle plate actuator assembly. The housing defines an outer configuration of the fixture and provides a supporting structure for the probe plate, the shuttle plate, and the diaphragm plate. The probe plate is supported on an upper portion of the housing and it includes a plurality of vacuum apertures, a plurality of coil springs, and two sets of upstanding spring-loaded probes which are of two different lengths so that they terminate at two different heights. The shuttle plate includes a plurality of elongated slots which correspond with the probes on the probe plate, and a plurality of stop discs which are operative for limiting downward movement of the diaphragm plate. The shuttle plate is slidably received on the probe plate and it is slidable for movement between first and second testing positions. The diaphragm plate includes a rigid back-up plate which is secured to the backside of a rubberized diaphragm element. The back-up plate includes a plurality of apertures which correspond to the probes on the probe plate, so that when the diaphragm assembly is drawn downwardly the probes pass upwardly through the apertures to make electrical contact with a circuit board supported thereon. The back-up plate further includes a plurality of holes which are positioned so as to correspond to the positions of the stop discs. The back-up plate is received and supported on the coil springs of the probe plate assembly.

The shuttle plate is slidable between a first testing position, wherein the stop discs are in nonaligned relation with the holes in the back-up plate, and a second testing position wherein the stop discs are in alignment with the holes. In the first testing position, the diaphragm assembly can be drawn downwardly to an upper level where the back-up plate is received in engagement with the stop discs, and in the second testing position the diaphragm assembly can be drawn downwardly to a lower level where the stop discs are received in the aligned holes in the back-up plate.

The motorized actuator assembly comprises a geared electric motor having a rotating drive shaft and an eccentric circular cam mounted on the drive shaft. The motor is preferably a high torque gear reduction motor, so that the drive shaft does not tend to freely rotate when it is not energized. The motorized actuator assembly is mounted within the housing of the test fixture underneath the probe plate and the shuttle plate. The motor is also preferably selected so that it uses very little electricity, and it is powered by conventional batteries which are preferably mounted in a battery fixture within the housing. The drive shaft and the cam extend upwardly through an aperture in the probe plate and the cam is received in a rectangular aperture in the shuttle plate which forms a bearing surface for the cam. The cam and the aperture are dimensioned, such that the cam slidingly engages the walls of the aperture, and as the cam is rotated it is operable for linearly reciprocating the shuttle plate between the first and second testing positions.

A switching assembly is provided for switching the motor on in order to slide the shuttle plate from one position to the other position, and for switching the motor off when the shuttle plate has reached the other position. The switching assembly comprises a pair of plunger switches which are manually operable for energizing the motor when the shuttle plate is in either one of the testing positions, and a pair of microswitches for automatically de-energizing the motor after the shuttle plate has reached the other testing position. The plunger switches are mounted on an outside wall of the fixture housing, and the microswitches are mounted on opposing sides of the motor in the path of rotation of the cam. Accordingly, the microswitches are automatically operated to de-energize the motor when the cam is rotated into either of the first or second testing positions.

For use and operation of the shuttle plate actuator, the shuttle plate is movable between the first and second positions by selectively depressing the plunger switches to energize the motor. Each time the motor is energized the cam is rotated, and the shuttle plate is moved from one test position to the other test position. In this regard, each time the cam is rotated approximately one-half of a revolution it engages the corresponding microswitch in its path to de-energize the motor, locking the shuttle plate in the selected test position. Thereafter, if a test in the original test position is desired, the other plunger switch is depressed, whereby the shuttle plate is returned to the original test position.

In an alternative embodiment it is contemplated that the computerized testing system would automatically effect the switching operations, thereby eliminating the manual plunger switches.

It is therefore an object of the instant invention to provide an improved shuttle plate actuator for reciprocating a shuttle plate in a bi-level test fixture.

It is another object to provide a motorized shuttle plate actuator which utilizes a cam to linearly reciprocate a shuttle plate between two testing positions.

It is yet another object to provide a motorized shuttle plate actuator which is controlled by a switching assembly.

It is still another object of the instant invention to provide a motorized shuttle plate actuator which does not require a significant amount of electrical power.

It is still yet another object to provide a motorized shuttle plate actuator which retains the shuttle plate in a set position when the test fixture is not in use.

Other objects, features and advantages of the invention shall become apparent as the description thereof proceeds when considered in connection with the accompanying illustrative drawings.

DESCRIPTION OF THE DRAWINGS

In the drawings which illustrate the best mode presently contemplated for carrying out the present invention.

DESCRIPTION OF THE INVENTION

Figure 1:
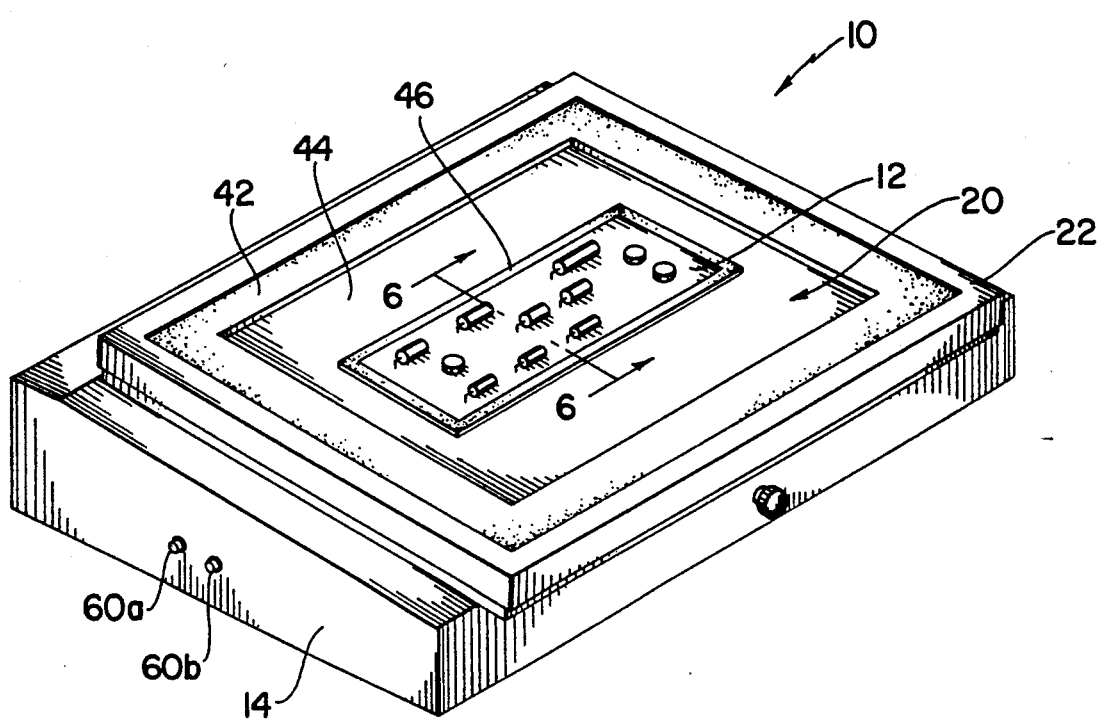
FIG. 1 is a perspective view of the bi-level test fixture of the instant invention.
Figure 2:
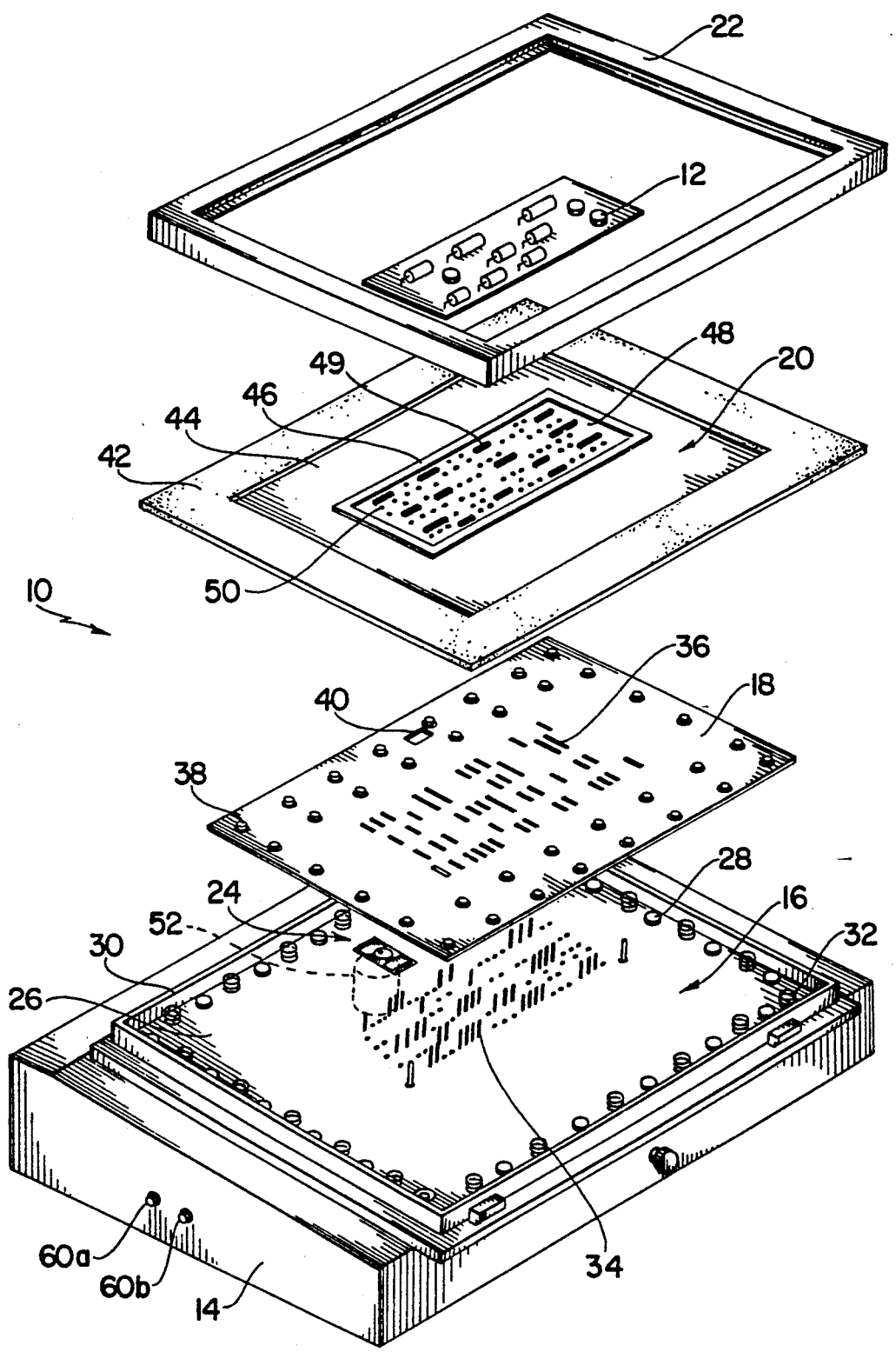
FIG. 2 is an exploded perspective view thereof.

Referring now to the drawings, and particularly to FIGS. 1 and 2, the bi-level test fixture of the instant invention is illustrated and is generally indicated at 10. The test fixture 10 is adapted to be assembled on a computerized test system (not shown), which is operable for use in testing printed circuit board assemblies. The test fixture 10 is further adapted for receiving a printed circuit board assembly 12 therein in order to electrically interconnect the circuit board assembly 12 to the test system so that the printed circuit board assembly 12 can be electronically tested.

The test fixture 10 comprises a housing assembly 14, a probe plate assembly generally indicated at 16, a shuttle plate 18, a diaphragm plate assembly generally indicated at 20, an upper frame 22, and a motorized shuttle plate actuator assembly generally indicated at 24. The housing 14 defines the outer peripheral configuration of the fixture 10 and it provides a supporting structure for the probe plate 16, the shuttle plate 18, the diaphragm plate 20, and the outer frame 22. The probe plate assembly 16 is supported on an upper portion of the housing 14, and it comprises a substantially rigid probe plate 26 having a plurality of vacuum apertures 28 therein, a peripheral support element 30, and a plurality of coil springs 32. The coil springs 32 bias the diaphragm plate 20 upwardly, and the vacuum apertures 28 are operative for providing communication between the interior of the fixture 10 and a conventional vacuum system so that vacuum can be applied to the interior of the fixture for drawing the diaphragm plate downwardly against the coil springs 32. The probe plate assembly 16 further comprises a plurality of spring-loaded probes 34 having plunger-like contacts. The probes 34 comprise two separate sets of probes which are of two different lengths and which are installed on the probe plate 26 so that they terminate at two different heights. The higher probes are utilized for functional testing of the circuit board 12 and the lower probes are utilized for incircuit testing of the circuit board 12. The shuttle plate 18 preferably comprises a substantially rigid, thin plate having a plurality of elongated slots 36 formed therein which correspond with the positions of the probes 34 on the probe plate 16. The shuttle plate 18 further comprises a plurality of stop discs 38 which are operative for limiting the downward movement of the diaphragm assembly 20 and it also includes a rectangular aperture 40 which forms a bearing surface for the motorized shuttle plate actuator 24. The shuttle plate 18 is received and supported on the probe plate 16 so that it slides back-and-forth relative to the probes 34 along the lengths of the elongated slots 36. The diaphragm plate assembly 20 comprises a rubberized diaphragm element 42 which includes an open receiving frame 44 having a border seal 46, and a substantially rigid backup plate 48 which is secured to the underside of the diaphragm element 42. The back-up plate 48 includes a plurality of elongated support elements for supporting the circuit board 12 thereon and further includes a plurality of apertures 50 which are aligned with the probes 34 on the probe plate 16, so that when the diaphragm assembly is drawn downwardly the upper end portions of the probes 34 pass upwardly through the apertures 50 to make electrical contact with the circuit board 12. The back-up plate 48 further includes a plurality of holes 51 in the underside thereof which are disposed in a pattern which corresponds to the orientation of stop discs 38 on the shuttle plate 18. The diaphragm assembly 20 is received and supported on the coil springs of the probe plate 16, and a peripheral portion of the diaphragm element 42 is captured between the upper frame 22 and the peripheral support element 30.

Figure 6:
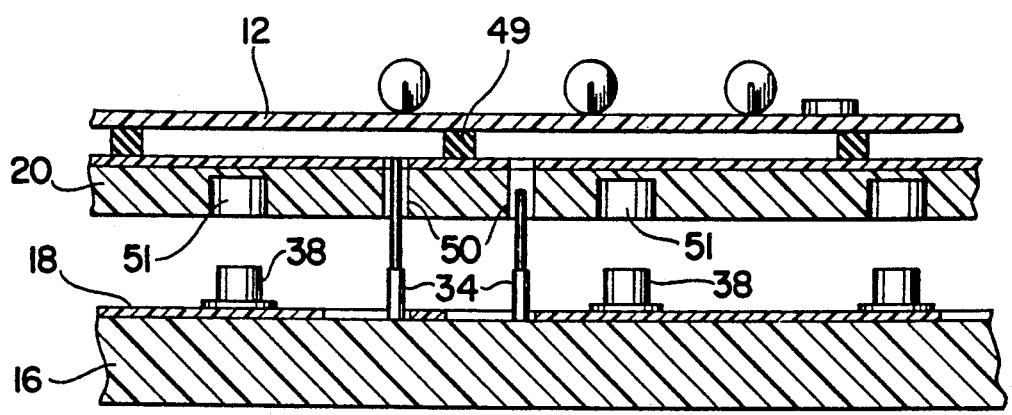
FIG. 6 is a sectional view taken along line 6-6 of FIG. 1.
Figure 7:
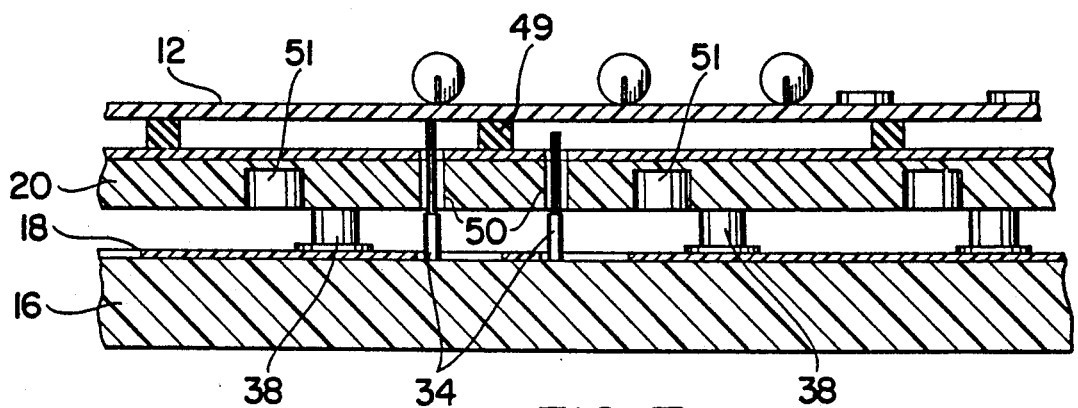
FIG. 7 is a similar view with the shuttle plate in the first testing position.
Figure 8:
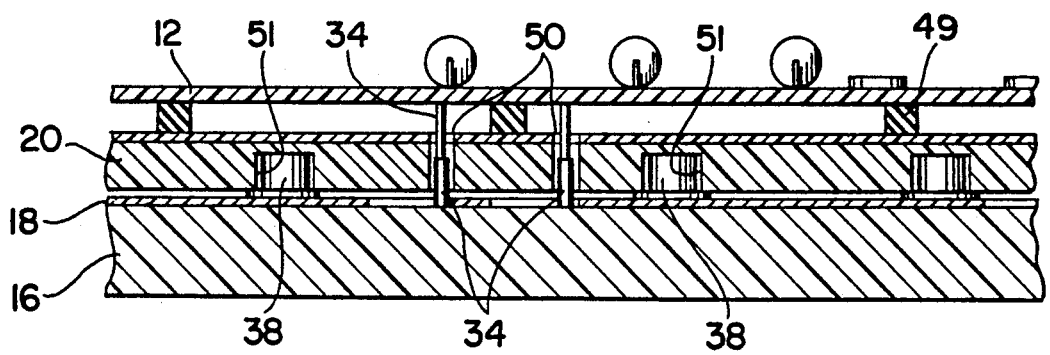
FIG. 8 is another similar view with the shuttle plate in the second testing position.

The operations of the shuttle plate 18 and the diaphragm plate 20 are most clearly illustrated in FIGS. 6-8. The shuttle plate 18 is slidable between a first or "functional" testing position, wherein the stop discs 38 are in nonaligned relation with the holes 51 in the underside of the backup plate 48 of the diaphragm assembly 20, and a second or "incircuit" testing position, wherein the stop discs 38 are in aligned relation with the holes 51. In the first testing position, as illustrated in FIG. 7, the test fixture 10 is operable for drawing the diaphragm plate assembly 16 downwardly until the back-up plate 48 engages the stop discs 38. When the back-up plate 48 is in engagement with the stop discs 38 the circuit board contacts only the higher set of probes which are operative for functional testing. In the second position, as illustrated in FIGS. 6 and 8, the test fixture is operable for drawing the diaphragm plate assembly 16 further downwardly, so that the stop discs 38 are received in the aligned holes 51 in the backup plate 48. When the back-up plate is drawn further downwardly in this manner the circuit board 12 is brought into contact with both the higher and lower sets of probes which are operative for carrying out incircuit testing.

Figure 3:
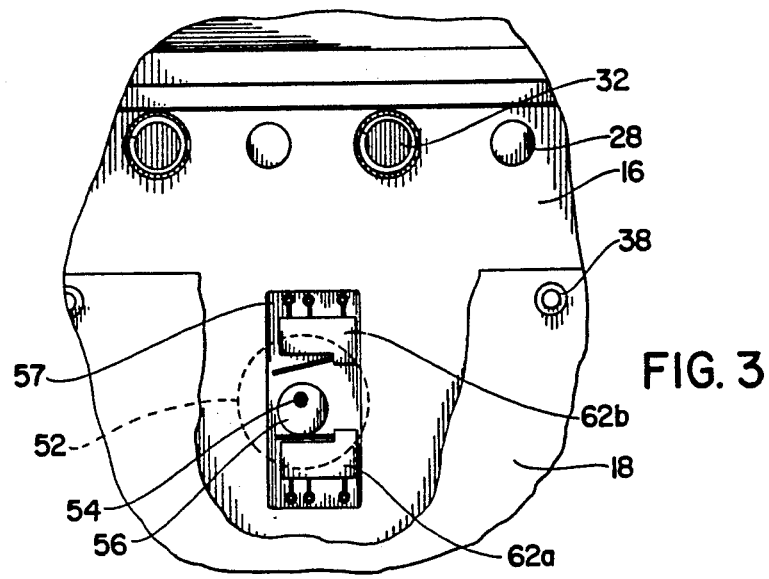
FIG. 3 is a plan view of the motorized shuttle plate actuator of the test fixture of the instant invention.
Figure 4:
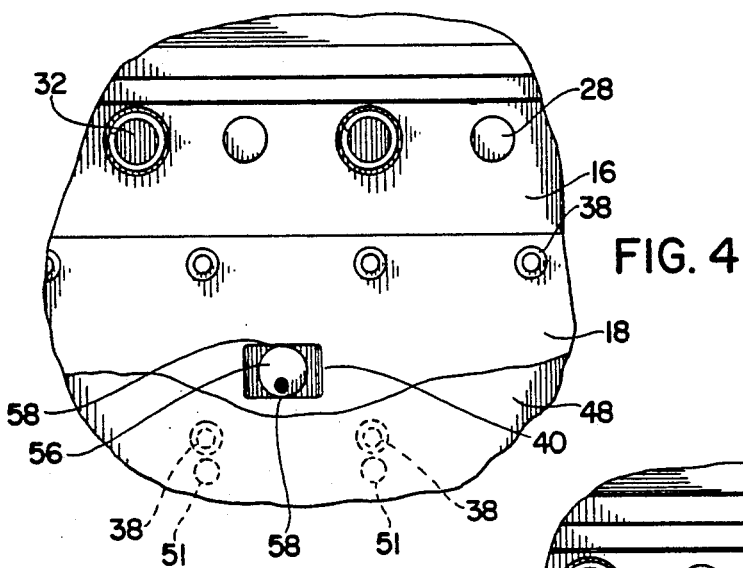
FIG. 4 is a plan view of the shuttle plate and cam in the first testing position.
Figure 5:
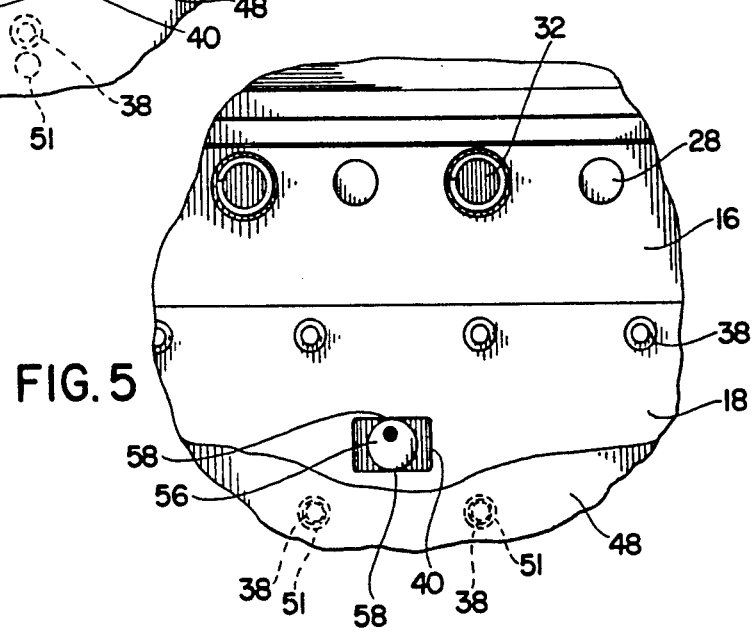
FIG. 5 is a similar plan view with the shuttle plate and cam in the second testing position.

Referring now to FIGS. 2 and 3, the motorized shuttle plate actuator 24 of the instant invention comprises a geared electric motor 52 having a rotating drive shaft 54, and a circular eccentric cam 56 mounted on the drive shaft 54. The motor 52 is preferably a miniature gear reduction high torque motor, so that it does not tend to rotate freely when it is not energized, and it is preferably small in size, such that it can be mounted within the housing 14 underneath the probe plate 16. The motor 52 is preferably selected so that it requires very little electrical power and may be powered by conventional batteries which can be mounted in a battery fixture within the housing 14, or by other suitable means. The drive shaft 54 and the cam 56 project upwardly through an aperture 57 in the probe plate 16 where the cam 56, is received within the rectangular aperture 40 in the shuttle plate 18. As illustrated most clearly in FIGS. 4 and 5, the cam 56 and the aperture 40 are dimensioned such that the cam 56 is captured between the two longer walls 58 of the aperture 40 for moving the shuttle plate 18 in substantially parallel relation to the two shorter walls. Accordingly, as the cam 56 is rotated, it is operable for linearly reciprocating the shuttle plate 18 between the first and second positions previously described. In FIG. 4, the cam 56 is rotated so as to position the shuttle plate 18 in the first position thereof wherein the stop discs 38 are in non-aligned relation with the holes 51 in the backup plate 48. On the other hand, in FIG. 5 the cam is rotated so as to position the shuttle plate 18 in the second position, wherein the stop discs 38 are in aligned relation with the holes 51.

A switching assembly is provided for switching the motor 52 on when it is desired to slide the shuttle plate 18 from the first testing position thereof to the second testing position thereof and vice versa, and also for switching the motor 52 off when the shuttle plate has been moved to the desired position. As will be seen in FIGS. 2 and 3, the switching assembly comprises a first plunger switch 60a for manually energizing the motor 52 when the shuttle plate 18 is in the first testing position, and a first microswitch 62a for automatically de-energizing the motor 52 when said shuttle plate reaches the second testing position. The switching assembly further comprises a second plunger switch 60b for manually energizing the motor 52 when the shuttle plate 18 is in the second testing position, and a second microswitch 62b for automatically de-energizing the motor 52 when the shuttle plate 18 reaches the first testing position. The plunger switches 60a, and 60b are mounted on an outside wall of the housing 14, and they are operated by a user for energizing the motor 52. The microswitches 62a, 62b are mounted on opposing sides of the motor 52, in the path of rotation of the cam 56, and they are automatically operated as the cam 56 rotates into the corresponding first and second testing positions to de-energize the motor 52. When the motor 52 is de-energized, the gear reduction ratio prevents the drive shaft from freely rotating and thus prevents the shuttle plate from freely sliding within the fixture. It has been found that inadvertent sliding of the shuttle plate when the fixture is not in use can cause damage to the shuttle plate and to the probes. Thus, it can be seen that the gear reduction motor prevents damage to the fixture and offers a significant advantage over the prior art actuators.

For use and operation of the bi-level test fixture 10 in combination with a test system, the fixture 10 is assembled with the test system and a circuit board assembly 12 is received on the diaphragm plate 20 of the fixture 10. The test fixture 10 can then be moved between the first and second testing positions by manipulating the plunger switches 60a or 60b to energize the motor 52 for rotating the cam 56 to shift the shuttle plate 18 between the two testing positions thereof. In this regard, each time the cam 56 has been rotated approximately one-half turn it engages the corresponding microswitch and de-energizes the motor 52, thus locking the shuttle plate 18 in the corresponding testing position. The test system can then be operated to apply a vacuum to the diaphragm plate assembly 20 through the vacuum apertures 28 to draw the diaphragm plate downwardly so that the spring probes 34 engage predetermined areas of the circuit board assembly 12 to electrically interconnect the circuit board assembly 12 to the test system. The test system can then be operated to electrically test the circuit board in a conventional manner. If another mode of testing is desired, the other plunger switch 60a or 60b is depressed so that the shuttle plate 18 is moved to the other testing position and the test system is activated again.

Although it can be seen that the instant embodiment is adapted for manual operation of the plunger switches, it is contemplated that in an alternative embodiment the computerized testing system would automatically effect the switching operations according to the test selected.

It is seen, therefore, that the instant invention provides an effective bi-level testing fixture for dual mode testing of printed circuit board assemblies. The test fixture 10 effectively utilizes a motor-driven cam assembly to shift the shuttle plate 18 between the first and second testing positions thereof, and since the motor 52 and the cam 56 are compact in size they can easily be mounted within the fixture housing 14. Also, since the motor 52 uses very little electricity it can be powered by conventional batteries which can also easily be accommodated within the fixture housing. Further, the simple switching system allows the motor to be switched on and off, for moving the shuttle plate between the first and second testing positions. Still further, when the motor is de-energized, the shuttle plate cannot freely slide so that inadvertent damage to the shuttle plate and probes caused by inadvertent sliding of the shuttle plate is avoided. Accordingly, it is seen that the bi-level test fixture of the instant invention represents a significant advancement in the art which has substantial commercial merit.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. In a bi-level test fixture for testing printed circuit boards, wherein the test fixture includes a fixed probe plate having a plurality of contact probes thereon and a slidable shuttle plate having a plurality of elongated slots therein, said shuttle plate being received on said probe plate so that said probes are received in said slots, said slots being configured to permit said shuttle plate to be slidably moved between first and second testing positions, the improvement comprising means for sliding said shuttle plate between said first and second testing positions, said means for sliding comprising:

a bearing surface on said shuttle plate;
cam means rotatably mounted in said test fixture for sliding engagement with said bearing surface; and
means for selectively rotating said cam means such that rotation of said cam is transmitted into a linear movement of said shuttle plate.

2. In the test fixture of claim 1, said rotating means comprising an electric motor having a rotating drive shaft.

3. In the test fixture of claim 2, said electric motor being powered by batteries.

4. In the test fixture of claim 2, said motor being a high torque, gear reduction motor.

5. In the test fixture of claim 2, said cam means comprising an eccentric circular cam mounted on said rotating drive shaft of said electric motor.

6. In the test fixture of claim 5, said cam means having a predetermined diameter, said bearing surface comprising a rectangular aperture in said shuttle plate, said aperture having a pair of longer walls and a pair of shorter walls, said longer walls being spaced apart by a widthwise dimension equal to said diameter of said cam, said cam being received in said aperture and engaging said longer walls of said aperture, wherein rotation of said cam causes said shuttle plate to move in substantially parallel relation to said shorter walls.

7. The tests fixture of claim 6 further comprising housing means for supporting said probe plate and said electric motor, said probe plate including an aperture therein which is positioned adjacent to the rectangular aperture in said shuttle plate, said electric motor being supported within said housing means so that it is positioned beneath the aperture in said probe plate, said drive shaft extending upwardly through said aperture in said probe plate, said cam being received in said rectangular aperture in said shuttle plate such that said cam is received in sliding engagement with said longer walls of said aperture.

8. The test fixture of claim 2 further comprising switching means for switching said motor on and off.

9. In the test fixture of claim 8, said switching means further comprising:

a first switching assembly which is operative for switching said motor on when said shuttle plate is in said first testing position and for switching said motor off after said shuttle plate is shifted to said second testing position; and
a second switching assembly which is operative for switching said motor on when said shuttle plate is in said second testing position and for switching said motor off when said shuttle plate is shifted to said first testing position.

10. In the test fixture of claim 9, said first and said second switching assemblies each comprising an externally mounted plunger switch for turning said motor on, and a microswitch mounted within a path of rotation of said cam for turning said motor off.

* * * * *